(12) United States Patent
Ko et al.

(10) Patent No.: US 9,695,500 B2
(45) Date of Patent: Jul. 4, 2017

(54) MASK FRAME ASSEMBLY FOR THIN LAYER DEPOSITION, A METHOD OF MANUFACTURING THE SAME, AND A METHOD OF MANUFACTURING DISPLAY APPARATUS BY USING A MASK FRAME ASSEMBLY

(71) Applicant: Samsung Display Co., Ltd., Yongin-si (KR)

(72) Inventors: Junhyeuk Ko, Yongin-si (KR); Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/974,356

(22) Filed: Dec. 18, 2015

(65) Prior Publication Data

US 2016/0312354 A1    Oct. 27, 2016

(30) Foreign Application Priority Data

Apr. 24, 2015 (KR) .................. 10-2015-0058265

(51) Int. Cl.
*H01L 21/00* (2006.01)
*C23C 14/04* (2006.01)
(Continued)

(52) U.S. Cl.
CPC ........ *C23C 14/042* (2013.01); *H01L 51/0011* (2013.01); *H01L 51/0021* (2013.01);
(Continued)

(58) Field of Classification Search
CPC ............... C23C 14/042; H01L 51/0011; H01L 51/0021; H01L 51/56; H01L 51/5012; H01L 51/5206; H01L 51/5221
(Continued)

(56) References Cited

U.S. PATENT DOCUMENTS 5,169,057 A * 12/1992 Blacka ............... B23K 1/206
                                                  228/180.21
7,987,812 B2 * 8/2011 Kim .................. B05B 15/045
                                                  118/504
(Continued)

FOREIGN PATENT DOCUMENTS

KR    10-2004-0028661    4/2004
KR    10-2006-0055613    5/2006
(Continued)

*Primary Examiner* — Xinning Niu
*Assistant Examiner* — Vu A Vu
(74) *Attorney, Agent, or Firm* — H.C. Park & Associates, PLC (57) ABSTRACT

A mask frame assembly including a frame including a first opening, a first mask including second openings that each has an area smaller than the first opening and a first surface having portions of the first surface connected to the frame. The mask frame assembly includes second masks disposed on a second surface of the first mask extending across the first opening in a first direction and arranged in a second direction that is substantially perpendicular. The second masks include pattern parts having a shape corresponding to the second openings. The pattern parts each include pattern holes configured to allow a deposition material to pass through. The second masks include a rib part disposed between the pattern parts. The rib part includes dummy holes each having an area greater than each of the pattern holes. The first mask is configured to block the deposition material passing through the dummy holes.

17 Claims, 5 Drawing Sheets

(51) Int. Cl.
*H01L 51/56* (2006.01)
*H01L 51/00* (2006.01)
H01L 51/50 (2006.01)
H01L 51/52 (2006.01)

(52) U.S. Cl.
CPC .......... *H01L 51/56* (2013.01); *H01L 51/5012* (2013.01); *H01L 51/5206* (2013.01); *H01L 51/5221* (2013.01)

(58) Field of Classification Search
USPC .......................................................... 438/34
See application file for complete search history.

(56) References Cited

U.S. PATENT DOCUMENTS

| | | | |
|---|---|---|---|
| 2004/0020435 A1 | 2/2004 | Tsuchiya et al. | |
| 2006/0103289 A1 | 5/2006 | Kim et al. | |
| 2012/0266813 A1* | 10/2012 | Hong | C23C 14/044 118/505 |
| 2013/0040047 A1* | 2/2013 | Karaki | C23C 14/042 427/66 |

FOREIGN PATENT DOCUMENTS

| | | |
|---|---|---|
| KR | 10-2007-0090018 | 9/2007 |
| KR | 10-2008-0048653 | 6/2008 |
| KR | 10-2009-0053417 | 5/2009 |

\* cited by examiner

MASK FRAME ASSEMBLY FOR THIN LAYER DEPOSITION, A METHOD OF MANUFACTURING THE SAME, AND A METHOD OF MANUFACTURING DISPLAY APPARATUS BY USING A MASK FRAME ASSEMBLY

CROSS-REFERENCE TO RELATED APPLICATION

This application claims priority from and the benefit of Korean Patent Application No. 10-2015-0058265, filed on Apr. 24, 2015, which is hereby incorporated by reference for all purposes as if fully set forth herein.

BACKGROUND

Field

One or more exemplary embodiments relate to a mask frame assembly, a method of manufacturing the same, and a method of manufacturing a display apparatus by using a mask frame assembly.

Discussion of the Background

Light-emitting devices are classified into inorganic light-emitting devices and organic light-emitting devices according to materials forming an emission layer. Recently, organic light-emitting devices have been actively developed since they have higher luminance and faster response times than inorganic light-emitting devices, and they also provide a wider range of colors. The organic light-emitting diode (OLED) display (e.g., flat-panel OLED display) is widely considered as the next-generation display due to its wide viewing angle, high contrast ratio, low driving voltage, light and thin design, and fast response time.

Typical manufacture of an organic light-emitting display may include forming on an organic film and/or an electrode via vacuum deposition. However, using typical manufacturing techniques when manufacturing high-resolution organic light emitting displays may result in a low quality organic light emitting display with a large shadow effect (i.e., unintended excessive shadowing due to high-incident-angle molecules relative the normal angle).

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask frame assembly, a method of manufacturing the same, and a method of manufacturing a display apparatus by using a mask frame assembly.

Additional aspects will be set forth in the detailed description which follows, and, in part, will be apparent from the disclosure, or may be learned by practice of the inventive concept.

An exemplary embodiment discloses a mask frame assembly that includes a frame including a first opening, a first mask including second openings that each has an area smaller than the first opening and a first surface having portions of the first surface connected to the frame. The mask frame assembly includes second masks disposed on a second surface of the first mask extending across the first opening in a first direction and arranged in a second direction that is substantially perpendicular. The second masks include pattern parts having a shape corresponding to the second openings. The pattern parts each include pattern holes configured to allow a deposition material to pass through. The second masks include a rib part disposed between the pattern parts. The rib part includes dummy holes each having an area greater than each of the pattern holes. The first mask is configured to block the deposition material passing through the dummy holes.

An exemplary embodiment also discloses a method of manufacturing a mask frame assembly. The method includes preparing a frame including a first opening. The method includes preparing a first mask including second openings each having an area smaller than the first opening. The method includes disposing a portion of a first surface of the first mask on the frame and preparing second masks. The second masks include pattern parts formed in a shape corresponding to the second openings and a rib part formed between the pattern parts. The method further includes disposing the second masks on a second surface of the first mask to extend across the first opening in a first direction and arranged in a second direction substantially perpendicular to the first direction. Preparing the second masks includes forming pattern holes in each of the pattern parts configured to allow a deposition material to pass through and forming dummy holes in the rib part, each having an area greater than each of the pattern holes.

An exemplary embodiment also discloses a method of manufacturing a display apparatus. The method includes depositing at least one of an organic layer and an electrode by using a mask frame assembly. The mask frame assembly includes a frame including a first opening, a first mask comprising second openings that each has an area smaller than the first opening. A portion of a first surface of the first mask is connected to the frame. The mask frame assembly includes second masks disposed on a second surface of the first mask extending across the first opening in a first direction and arranged in a second direction substantially perpendicular to the first direction. The second masks include pattern parts formed in a shape corresponding to the second opening, each of the pattern parts comprise pattern holes configured to allow a deposition material to pass through. The second masks include a rib part formed between the pattern parts. The rib part includes dummy holes each having an area greater than each of the pattern holes. The first mask is configured to block the deposition material passing through the dummy holes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
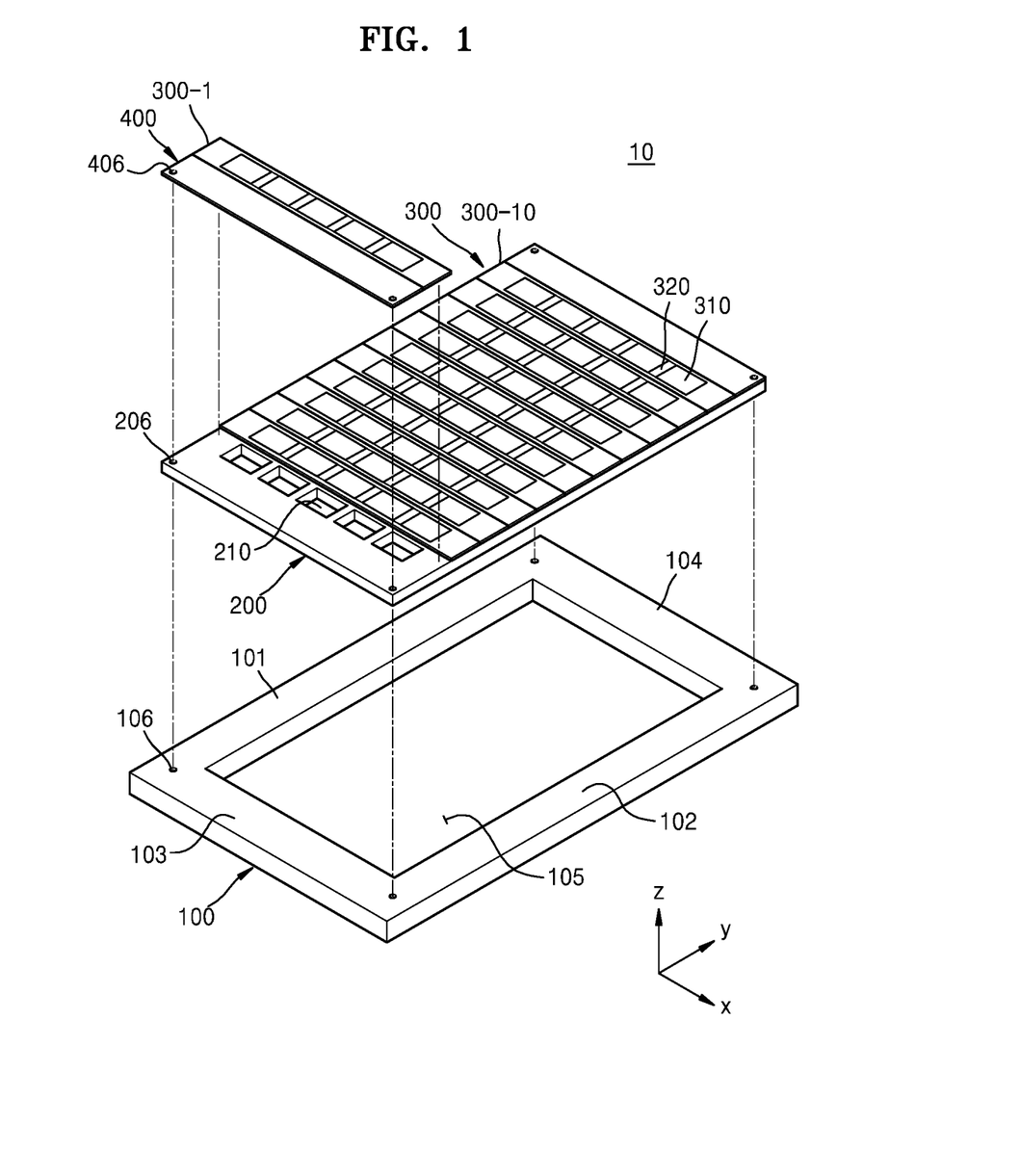
FIG. 1 illustrates an exploded perspective view of a mask frame assembly according to an exemplary embodiment.
Figure 2:
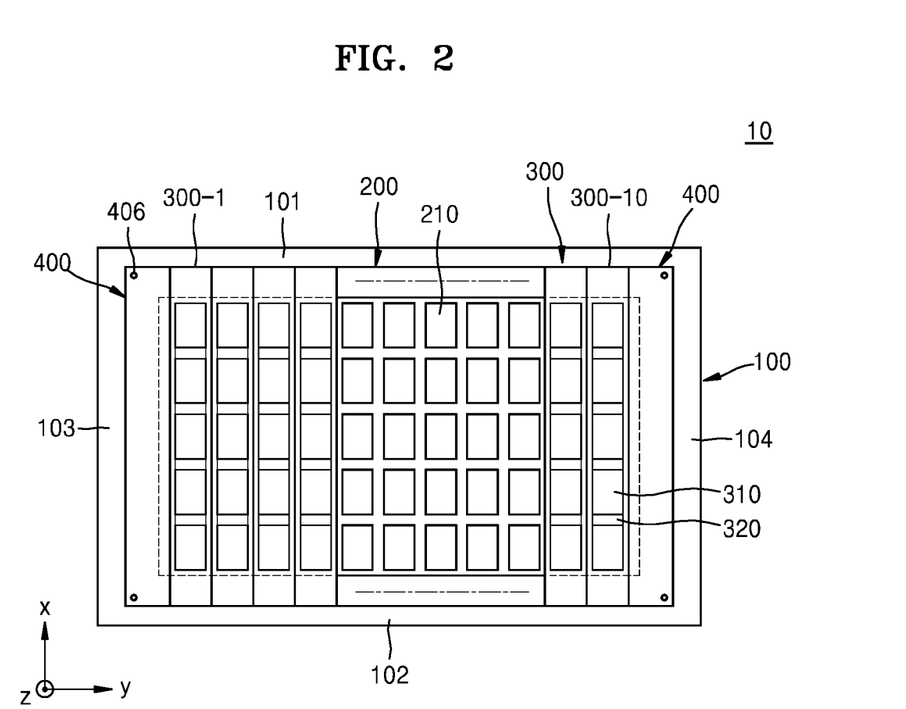
FIG. 2 illustrates a plan view of an upper portion of the mask frame assembly of FIG. 1.
Figure 3:
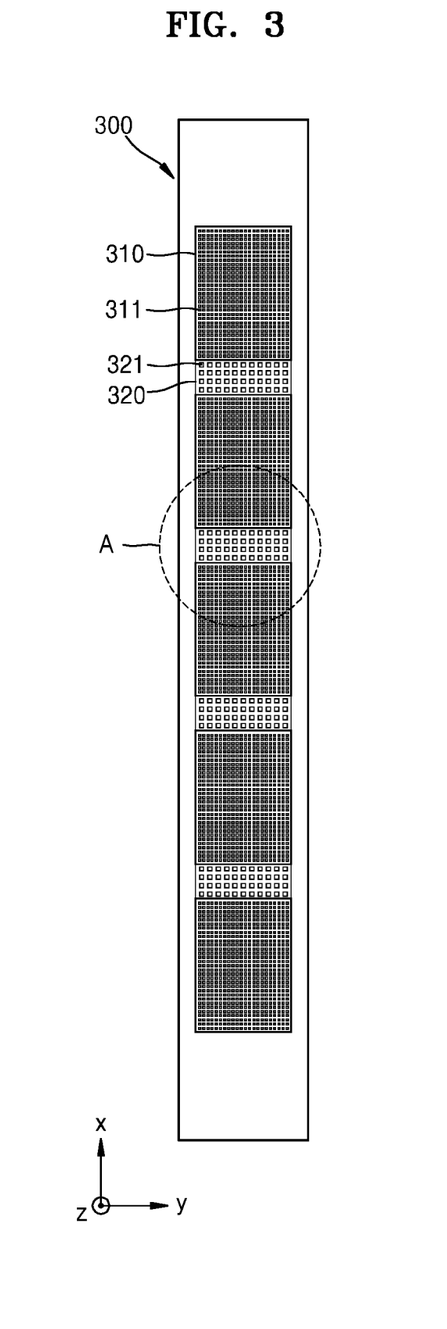
FIG. 3 illustrates a plan view of an upper portion of a mask in FIG. 2.
Figure 4:
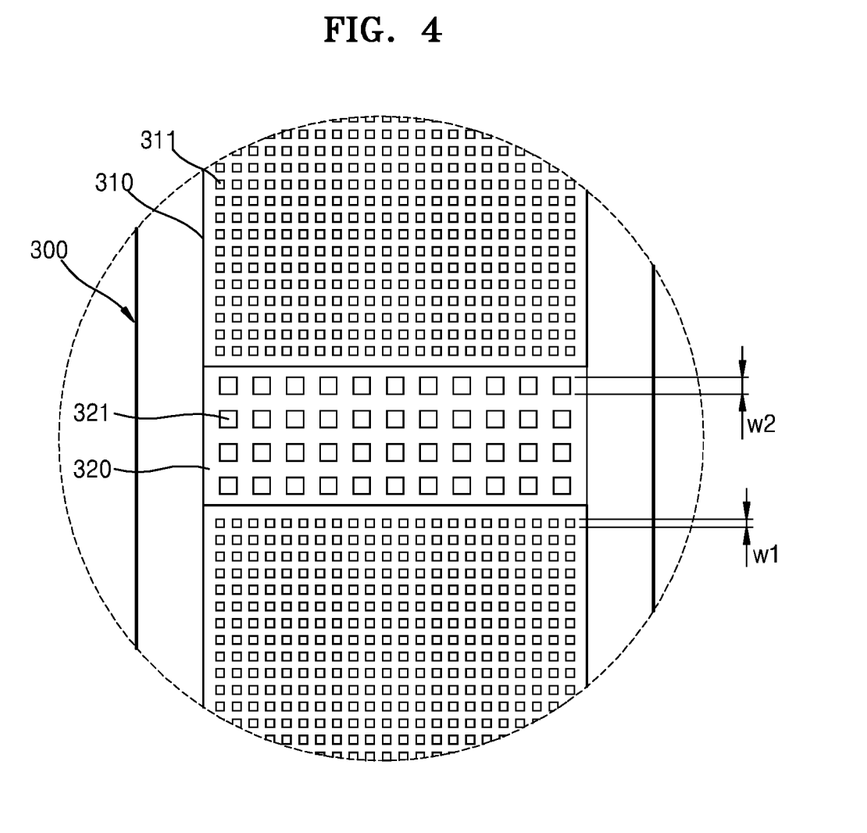
FIG. 4 illustrates an enlarged plan view of an area A of FIG. 3.

FIG. 1 illustrates an exploded perspective view of a mask frame assembly according to an exemplary embodiment. FIG. 2 illustrates a plan view of an upper portion of the mask frame assembly of FIG. 1. FIG. 3 illustrates a plan view of an upper portion of a mask of FIG. 2. FIG. 4 illustrates an enlarged plan view of an area A of FIG. 3.

Referring to FIG. 1, a mask frame assembly 10 may include a frame 100, a first mask 200, and second masks 300.

The frame 100 may include a first opening 105. The first mask 200 may include second openings 210. Each second opening 210 may have a smaller area than the first opening 105. Some portions of a first surface of the first mask 200 may be adhered to the frame 100. Each of the second masks 300 may extend across the first opening 105 in a first direction (e.g., along the x-axis) and include pattern parts 310 formed in a shape corresponding to the second openings 210. Each of the second masks 300 may also include rib parts 320 disposed or otherwise formed between two pattern parts 310. The second masks 300 may be arranged in a second direction (e.g., along the y-axis), which is substantially perpendicular to the first direction. The second masks 300 may be adhered to a second surface of the first mask 200 that is opposite to the first surface of the first mask 200.

In an exemplary embodiment, the mask frame assembly 10 may further include an alignment stick 400 that is disposed outside at least one of second masks 300-1 and 300-10. Second masks 300-1 and 300-10 are disposed at both ends of the first mask 200 in the second direction. At least some portions of the alignment stick 400 may be adhered to the second surface of the first mask 200 so as to be a reference point for disposing the second masks 300.

Hereinafter, each component mentioned above will be described in detail with reference to FIG. 1, FIG. 2, FIG. 3, and FIG. 4.

Referring to FIGS. 1 and 2, the frame 100 may be formed in a quadrangle shape (e.g., a rectangular shape) having a first opening 105 in the middle of the frame, which is the first opening 105. The frame 100 may include a first support part 101 and a second support part 102 that are disposed apart from and substantially parallel to each other in the first direction (e.g., along the x-axis). The frame may include a third support part 103 and a fourth support part 104 that are disposed apart from and substantially parallel to each other in the second direction (e.g., along the y-axis).

The first support part 101 and the second support part 102 may be connected to the third support part 103 and the fourth support part 104 to form an outer frame of the mask frame assembly 10. Here, the frame 100 in FIG. 1 has the first opening 105 formed in a quadrangle shape in the middle of the frame 100 but exemplary embodiment are not limited to this configuration. For example, the first opening 105 may be formed in various shapes, such as a circle, an oval, or a polygonal shape.

In an exemplary embodiment, the frame 100 may include a metal material with high rigidity. Although not illustrated, the first mask 200 and the second masks 300 may be fixed to the frame 100 by welding. During the welding process, heat may be generated around a welding part (not shown) so that thermal strain may cause a formation of a small substance in the frame 100.

The first mask 200 may include the second openings 210 each having a smaller area than the first opening 105 of the frame 100. An outer region of the first mask 200 may be adhered to the frame 100. The second openings 210 may be formed in a shape corresponding to the pattern parts 310 (described later). A deposition material may pass through the second openings 210 in the same manner as in the pattern parts 310 during a deposition process.

As illustrated in FIGS. 1 and 2, the first mask 200 may be formed as one body and include the second openings 210. However, exemplary embodiments are not limited to such a structure. For example, the first mask 200 may include one opening in the middle as in the frame 100 and define the second openings 210 by welding support sticks (not shown) that extend in the first direction and support sticks that extend in the second direction to the first mask 200. Alternatively, the second openings 210 may be defined by coupling the support sticks with grooves formed in the first mask 200 to accommodate the support sticks.

Also, each of the second masks 300 may extend in the first direction to be adhered to the first mask 200 that may be formed of a material having suitable rigidity or having predetermined elasticity.

The second mask 300 may be formed as one large member in a single shape to adhere to the first mask 200. In an exemplary embodiment, the second mask 300 may be formed as division masks in a stick shape in order to distribute the weight of the second mask 300. Hereinafter, the second mask 300 is described as being form as division masks in a stick shape for ease of reference.

The first mask 200 and the second masks 300 may include magnetic thin films. The first mask 200 and the second masks 300 may include nickel or nickel alloy. For example, the first mask 200 and the second masks 300 may be formed of nickel-cobalt alloy. Nickel-cobalt alloy has excellent surface roughness and is easily formed in a micro pattern.

The first mask 200 and the second masks 300 may be formed by etching. For example, a photoresist layer having the same pattern as the second openings 210 and pattern holes 311 (refer to FIGS. 3 and 4) may be formed on a thin film by using a photoresist. In an alternate example, a film having the same pattern as the second openings 210 and pattern holes 311 may be attached to a thin film. Regardless, the thin film may be etched to manufacture the first mask 200 and the second masks 300. The first mask 200 and the second masks 300 may be manufactured by electro-forming or electro-less plating.

Referring to FIGS. 3 and 4, the second mask 300 may include the pattern parts 310 through which a deposition material passes to define a deposition region on a substrate. The second mask 300 may also include the rib parts 320 that are formed between the pattern parts 310 to connect the pattern parts 310 to each other.

The pattern parts 310 may include the pattern holes 311 through which a deposition material passes. The pattern parts 310 may be disposed to respectively correspond to the second openings 210 of the first mask 200. A deposition material that passes through the second openings 210 and the pattern parts 310 may define a deposition region on a substrate.

The pattern holes 311 formed in the pattern parts 310 may have a masking pattern formed in a rectangular shape as illustrated in FIGS. 3 and 4. However, exemplary embodiments are not limited to the rectangular shape, and a person of ordinary skill in the art would know that the pattern holes 311 may be formed in various ways. In other words, the pattern holes 311 may have a making pattern that is entirely opened, a masking pattern formed in a slit shape, a dot shape, or a masking pattern formed in a polygonal shape. The number, a deposition position, and a shape of the pattern holes 311 in FIGS. 3 and 4 may vary depending on the particular exemplary embodiments.

The rib part 320 may be formed between the pattern parts 310 to connect the pattern parts 310 to each other. In other words, the rib part 320 may be disposed between one pattern part 310 and a neighboring pattern part 310.

The rib parts 320 may include dummy holes 321, each having a larger area than each of the pattern holes 311 formed in the pattern parts 310. In FIGS. 3 and 4, the pattern holes 311 and the dummy holes 321 are formed in a square shape with a first width w1 and a second width w2, respectively.

Each of the pattern holes 311 may be formed in a square shape having a width and a length of 20 µm. Each of the dummy holes 321 may have a larger area than each of the pattern holes 311. For example, each of the dummy holes 321 may have a width and a length of about 100 µm to about 500 µm, which is 5 to 25 times greater than the width of the pattern holes 311. However, the shape of the dummy holes 321 is not limited thereto a square shape, and may have various shapes such as a slip shape or a polygonal shape, as described for the pattern holes 311.

Each of the dummy holes 321 formed in the rib part 320 may have an area greater than each of the pattern holes 311 for the following reasons.

As described above, the pattern holes 311 may be formed for the deposition material to pass through in order to define the deposition region on the substrate. The pattern holes 311 may be formed in each of the pattern parts 310. The pattern parts 310 may correspond to the second opening 210 of the first mask 200, and thus, the deposition material may pass through the pattern parts 310.

The deposition material may not pass through the dummy holes 321 formed in the rib part 320. Accordingly, when a foreign material enters between the first mask 200 and the second mask 300 while a deposition process is performed by using the mask frame assembly 10, the foreign material may cause a lifting phenomenon that occurs between the first mask 200 and the rib part 320. The lifting phenomenon occurs when some portions of the second mask 300 are lifted from the first mask 200, which is due to the presence of the foreign material that enters between the first mask 200 and the rib part 320 of the second mask 300. Due to the lifting phenomenon an incident angle of the deposition material passing through the pattern holes 311 may change. As a result, the deposition material may not be precisely deposited in the deposition region to thereby cause a defect.

To prevent the lifting phenomenon, the second mask 300 of the mask frame assembly 10 may include the dummy hole 321 having a larger area than the pattern hole 311 through which the deposition material passes in the rib part 320 connecting the pattern parts 310 so that a foreign material entering to the rib part 320 during the deposition process may be led to the dummy hole 321. A diameter of a foreign material is generally less than 500 μm and a diameter of the dummy hole 321 formed in the rib part 320 is about 100 μm to about 500 μm so that the second mask 300 may not be lifted from the first mask 200 due to a foreign material.

Referring to FIGS. 1 and 2 again, the frame 100 may include a first alignment key 106 passing through at least some portions of the frame 100 to align the frame 100, the first mask 200, and the second mask 300. The first mask 200 may include a second alignment key 206 passing through the first mask 200. The second mask 300 may include a third alignment key 406.

As shown in FIGS. 1 and 2, the third alignment key 406 may be formed in an alignment stick 400 instead of the second mask 300. For ease of reference, the third alignment key 406 is described as being formed in the alignment stick 400 in FIGS. 1 and 2. However, exemplary embodiments are not limited to the third alignment key 406 being formed in the alignment stick 400. In other words, the third alignment key 406 may also be formed in the second mask 300. Thus, the third alignment key 406 may be formed in any position to align the frame 100, the first mask 200, and the second mask 300 in a row.

The alignment stick 400 may be formed in the same shape as the second mask 300. The alignment stick 400 may be disposed outside at least one of the second masks 300-1 and 300-10 disposed at both ends of the first mask 200 in the second direction from among the second masks 300. The alignment stick 400 may be disposed outside the second masks 300-1 and 300-10 and cover some portions of the first opening 105 so that a deposition material passes only through the pattern parts 310.

In this regard, the first alignment key 106, the second alignment key 206, and the third alignment key 406 may be formed to overlap each other as illustrated in FIG. 1. The first alignment key 106, the second alignment key 206, and the third alignment key 406 may be used to align the frame 100, the first mask 200, and the second mask 300 in row when coupling the first mask 200 onto the frame 100 and coupling the second mask 300 onto the first mask 200.

A method of manufacturing the mask frame assembly 10 according to an exemplary embodiment includes aligning components. For example, aligning components may include aligning the frame 100, the first mask 200, the second mask 300, and the alignment stick 400, by using the first alignment key 106, the second alignment key 206, and the third alignment key 406, and coupling the alignment keys 106, 206, and 406 to each other by welding. The description of the method is the same as the descriptions above and thus, they are omitted for brevity.

Figure 5:
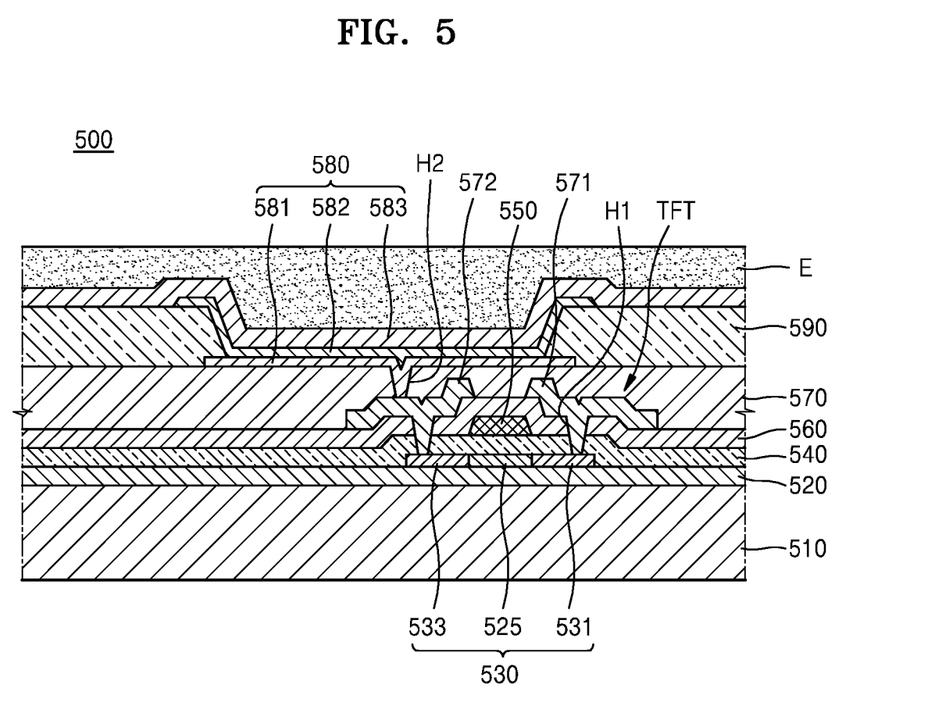
FIG. 5 illustrates a cross-sectional view of a display apparatus manufactured using the mask frame assembly of FIG. 1.

FIG. 5 illustrates a cross-sectional view of a display apparatus manufactured by using the mask frame assembly 10 of FIG. 1.

Referring to FIG. 5, a display apparatus 500 may include a substrate 510 and a display portion (not shown). Also, the display apparatus 500 may include a thin-film encapsulation layer E and/or an encapsulation substrate (not shown) that is formed on an upper portion of the display portion. Here, the encapsulation substrate is the same as or similar to an encapsulation substrate use with a general display apparatus, and a description thereof will be omitted. Hereinafter, the display apparatus 500 will be described as including the thin-film encapsulation layer E for ease of reference.

The display portion may be formed on the substrate 510. Here, the display portion may include a thin-film transistor TFT, a passivation layer 570 formed to cover the thin-film transistor TFT, and an organic light-emitting diode (OLED) device 580 formed on the passivation layer 570.

The substrate 510 may include a glass material. However, the present exemplary embodiment is not necessarily limited to a substrate 510 including a glass material. The substrate 510 may include a plastic material. The substrate 510 may include a metallic material such as stainless steel (SUS) or titanium (Ti). Also, the substrate 510 may be formed of polyimide (PI). Hereinafter, the substrate 510 is described as including a glass material for ease of reference.

A buffer layer 520 formed of an organic compound and/or an inorganic compound may be further formed on the substrate 510. For example, the buffer layer 520 may include silicon oxide ($SiO_X$) (wherein, $X \geq 1$) or silicon nitride ($SiN_X$) (wherein, $X \geq 1$).

An active layer 530 arranged in a predetermined pattern may be formed on the buffer layer 520. The active layer 530 may be buried by a gate insulating layer 540. The active layer 530 may include a source region 531, a drain region 533, and a channel region 525 between the source region 531 and the drain region 533.

The active layer 530 may include various materials. For example, the active layer 530 may include an inorganic semiconductor material such as amorphous silicon or crystalline silicon. As another example, the active layer 530 may include an oxide semiconductor. As another example, the active layer 530 may include an organic semiconductor material. However, hereinafter, the active layer 530 is described as include amorphous silicon for ease of reference.

An amorphous silicon layer may be formed on the buffer layer 520. The amorphous silicon layer may be crystallized to form a polycrystalline silicon layer. The polycrystalline silicon layer may be patterned to form the active layer 530. The source region 531 and the drain region 533 of the active layer 530 may be doped with impurities depending on a type of a thin-film transistor. For example, the thin-film transistor may be a driving thin-film transistor (not shown), a switching thin-film transistor (not shown), or the like.

A gate electrode 550 corresponding to the active layer 530 and an interlayer insulating layer 560 burying the gate electrode 550 may be formed on an upper surface of the gate insulating layer 540.

Contact holes H1 may be formed in the interlayer insulating layer 560 and the gate insulating layer 540 and a source electrode 571, and a drain electrode 572 may be formed on the interlayer insulating layer 560 so that the source electrode 571 and the drain electrode 572 respectively contact the source region 531 and the drain region 533 through the contact holes H1.

The thin-film transistor TFT may be formed in the above process, and the passivation layer 570 may be formed on the thin film transistor TFT. A pixel electrode 581 of an organic light-emitting diode (OLED) device may be formed on the passivation layer 570. The pixel electrode 581 may contact the drain electrode 572 of the thin-film transistor TFT through a via hole H2 formed in the passivation layer 570. The passivation layer 570 may be formed of an inorganic material and/or an organic material as a single layer or two or more layers. The passivation layer 570 may be a planarization layer that makes an upper surface of the passivation layer 570 even regardless of the unevenness of a lower layer. Alternatively, the passivation layer 570 may be formed to be uneven along with the unevenness of the lower layer. Also, the passivation layer 570 may include a transparent insulating layer to exhibit a resonance effect.

After forming the pixel electrode 581 on the passivation layer 570, a pixel-defining layer 590 may be formed of an organic material and/or an inorganic material so as to cover the pixel electrode 581 and the passivation layer 570 and may have an opening that exposes the pixel electrode 581.

An intermediate layer 582 and an opposite electrode 583 may be formed on at least the pixel electrode 581.

The pixel electrode 581 may serve as an anode electrode while the opposite electrode 583 may serve as a cathode electrode, or vice versa.

The pixel electrode 581 and the opposite electrode 583 may be insulated from each other by the intermediate layer 582, and an organic emission layer may emit light by applying voltages having different polarities to the intermediate layer 582.

The intermediate layer 582 may include the organic emission layer. As another example, the intermediate layer 582 may include the organic emission layer and may further include at least one selected from a hole injection layer (HIL), a hole transport layer (HTL), an electron transport layer (ETL), and an electron injection layer (EIL).

In another exemplary embodiment, one unit pixel may include sub-pixels R, G, is and B (not illustrated). The sub-pixels R, G, and B (not illustrated) may emit red, green, and blue light. In another exemplary embodiment, one unit pixel P may include sub-pixels emitting red, green, blue, and white light.

The thin-film encapsulation layer E may include inorganic layers or include an inorganic layer and an organic layer.

The organic layer of the thin-film encapsulation layer E may include a polymer. The organic layer of the thin-film encapsulation layer E may be a single layer or a stack layer. The organic layer of the thin-film encapsulation layer E may include at least one of polyethylene terephthalate, polyimide, polycarbonate, epoxy, polyethylene, and polyacrylate. Furthermore, the organic layer may include polyacrylates. More specifically, the organic layer may include a polymer of a monomer composition including a diacrylate-group monomer and a triacrylate-group monomer. A monoacrylate-group monomer may be further included in the monomer composition. In addition, a well-known photoinitiator such as thermoplastic polyolefin (TPO) may be further included in the monomer composition. However, exemplary embodiments are not limited to the materials listed.

The inorganic layer of the thin-film encapsulation layer E may be a single layer or a stack layer. The inorganic layer of the thin-film encapsulation layer E may include a metal oxide or a metal nitride. More specifically, the inorganic layer may include at least one of silicon nitride ($SiN_x$), aluminum oxide ($Al_2O_3$), silicon oxide ($SiO_2$), and titanium oxide ($TiO_2$).

The uppermost layer of the thin-film encapsulation layer E, which is exposed to the outside, may be formed of an inorganic layer to prevent infiltration of humidity toward the OLED device 580.

In an exemplary embodiment, the thin film encapsulation layer E may include at least one sandwich structure where at least one organic layer is inserted between at least two inorganic layers. For example, the thin film encapsulation layer E may include a first inorganic layer, a first organic layer, and a second inorganic layer sequentially from the upper portion of the OLED device 580.

In an exemplary embodiment, the thin film encapsulation layer E may include a sandwich structure where at least one inorganic layer is inserted between at least two organic layers. For example, the thin film encapsulation layer E may include the first organic layer, the first inorganic layer, and a second organic layer sequentially from the upper portion of the OLED device 580.

In an exemplary embodiment, the thin film encapsulation layer E may include a sandwich structure where at least one organic layer is inserted between at least two inorganic layers and a sandwich structure where at least one inorganic layer is inserted between at least two organic layers. For example, the thin film encapsulation layer E may include the first inorganic layer, the first organic layer, the second inorganic layer, a second organic layer, and a third inorganic layer sequentially from the upper portion of the OLED device 580. In another example, the thin film encapsulation layer E may include the first inorganic layer, the first organic layer, the second inorganic layer, the second organic layer, the third inorganic layer, a third organic layer, and a fourth inorganic layer sequentially from the upper portion of the OLED device 580.

A halogenated metal layer including lithium fluoride (LiF) may be additionally included between the OLED device 580 and the first inorganic layer. The halogenated metal layer may prevent the OLED device 580 from being damaged when the first inorganic layer is formed by using a sputtering method.

The first organic layer may have a narrower area than the second inorganic layer, and the second organic layer may have a narrower area than the third inorganic layer.

As described above, according to one or more exemplary embodiments, a defect caused by a foreign material entering into a mask frame assembly during a deposition process may be reduced. However, the scope of the inventive concept is not limited to this effect.

Also, in order to manufacture a high-resolution organic light-emitting display apparatus, a shadow effect needs to be reduced or totally prevented from occurring to create a high-quality display. According to exemplary embodiments, a deposition process is performed in a state when a substrate and a mask are closely adhered to each other, thereby reducing or eliminating the shadow effect.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A mask frame assembly, comprising:
a frame comprising a first opening;
a first mask comprising:
second openings that each have an area smaller than the first opening; and
a first surface having portions of the first surface connected to the frame; and
second masks disposed on a second surface of the first mask extending across the first opening in a first direction and arranged in a second direction that is substantially perpendicular, the second masks comprising:
pattern parts having a shape corresponding to the second openings, the pattern parts each comprising pattern holes configured to allow a deposition material to pass through; and
a rib part disposed between the pattern parts, the rib part comprises dummy holes each having an area greater than each of the pattern holes,
wherein the first mask is configured to block the deposition material passing through the dummy hole.

2. The mask frame assembly of claim 1, further comprising an alignment stick disposed outside at least one of two second masks disposed at both ends of the first mask in the second direction,
wherein portions of the alignment stick are connected to the second surface of the first mask to be a reference point for disposing the second masks.

3. The mask frame assembly of claim 1, wherein the frame comprises a first alignment key passing through portions of the frame.

4. The mask frame assembly of claim 3, wherein the first mask comprises a second alignment key passing through the first mask.

5. The mask frame assembly of claim 4, wherein at least one second mask comprise a third alignment key passing through the at least one second mask.

6. The mask frame assembly of claim 5, wherein the first alignment key, the second alignment key, and the third alignment key are formed to overlap each other.

7. The mask frame assembly of claim 2, wherein the frame comprises a first alignment key passing through portions of the frame.

8. The mask frame assembly of claim 7, wherein the first mask comprises a second alignment key passing through the first mask.

9. The mask frame assembly of claim 8, wherein the alignment stick comprises a third alignment key passing through the second masks.

10. The mask frame assembly of claim 9, wherein the first alignment key, the second alignment key, and the third alignment key are formed to overlap each other.

11. The mask frame assembly of claim 1, wherein the pattern holes are formed in a polygonal shape.

12. The mask frame assembly of claim 1, wherein the dummy holes are formed in a polygonal shape.

13. A method of manufacturing a mask frame assembly, the method comprising:
preparing a frame comprising a first opening;
preparing a first mask comprising second openings each having an area smaller than the first opening;
disposing a portion of a first surface of the first mask on the frame;
preparing second masks, the second masks comprising:
pattern parts formed in a shape corresponding to the second openings; and
a rib part formed between the pattern parts; and
disposing the second masks on a second surface of the first mask to extend across the first opening in a first direction and arranged in a second direction substantially perpendicular to the first direction,
wherein the preparing the second masks comprises:
forming pattern holes in each of the pattern parts configured to allow a deposition material to pass through; and
forming dummy holes in the rib part, each having an area greater than each of the pattern holes.

14. The method of claim 13, wherein the disposing the second masks on the second surface of the first mask comprises preparing an alignment stick disposed outside at least one of two second masks disposed at both ends of the first mask in the second direction,
wherein portions of the alignment stick are disposed on the second surface of the first mask, and the alignment stick is a reference point when the second masks are disposed on the second surface of the first mask.

15. The method of claim 14, wherein the pattern holes have a polygonal shape.

16. The method of claim 14, wherein the dummy holes have a polygonal shape.

17. A method of manufacturing a display apparatus, the method comprising:
depositing at least one of an organic layer and an electrode by using a mask frame assembly, the mask frame comprising:
a frame comprising a first opening;
a first mask comprising second openings that each have an area smaller than the first opening, and a portion of a first surface of the first mask is connected to the frame; and
second masks disposed on a second surface of the first mask extending across the first opening in a first direction and arranged in a second direction substantially perpendicular to the first direction, the second masks comprising:
pattern parts formed in a shape corresponding to the second opening, each of the pattern parts comprising pattern holes configured to allow a deposition material to pass through; and
a rib part formed between the pattern parts, the rib part comprising dummy holes each having an area greater than each of the pattern holes,
wherein the first mask is configured to block the deposition material passing through the dummy holes.

* * * * *